(12) United States Patent
Yamamoto

(10) Patent No.: US 7,212,031 B2
(45) Date of Patent: May 1, 2007

(54) SEMICONDUCTOR DEVICE AND MANUFACTURING METHOD OF THE SAME

(75) Inventor: Kenji Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 93 days.

(21) Appl. No.: 11/203,062

(22) Filed: Aug. 15, 2005

(65) Prior Publication Data

US 2006/0033526 A1   Feb. 16, 2006

(30) Foreign Application Priority Data

Aug. 16, 2004   (JP) .............................. 2004-236412

(51) Int. Cl.
*H03K 19/173* (2006.01)
(52) U.S. Cl. .......................................... 326/38; 326/41
(58) Field of Classification Search ............ 326/37–39, 326/41, 47, 101
See application file for complete search history.

(56) References Cited

U.S. PATENT DOCUMENTS 6,674,307 B2 * 1/2004 Mizuno ...................... 326/113
6,943,584 B2 * 9/2005 Aoki .......................... 326/47
6,977,521 B2 * 12/2005 Wang ......................... 326/41

FOREIGN PATENT DOCUMENTS

| JP | 2545461 A | 7/1996 |
|----|-----------|--------|
| JP | 2002-198801 A | 7/2002 |

* cited by examiner

*Primary Examiner*—James H. Cho
(74) *Attorney, Agent, or Firm*—Sughrue Mion, PLLC

(57) ABSTRACT

A semiconductor device has a plurality of universal logic cells, a power supply line, a ground line, a first interconnection and a second interconnection. Each universal logic cell includes first to seventh nodes formed in a top layer of common interconnection layers which are allocated to the universal logic cells. The first interconnection connects the third node, the fourth node and the fifth node, and the second interconnection connects the power supply line and the first node. Or, the first interconnection connects the second node, the sixth node and the seventh node, and the second interconnection connects the ground line and the first node. The first and second interconnections are formed in a customize interconnection layer provided on the common interconnection layers.

20 Claims, 13 Drawing Sheets

UNIVERSAL LOGIC CELL 60'

UNIVERSAL LOGIC CELL 60

SEMICONDUCTOR DEVICE 70

SEMICONDUCTOR DEVICE 70

UNIVERSAL LOGIC CELL 60'

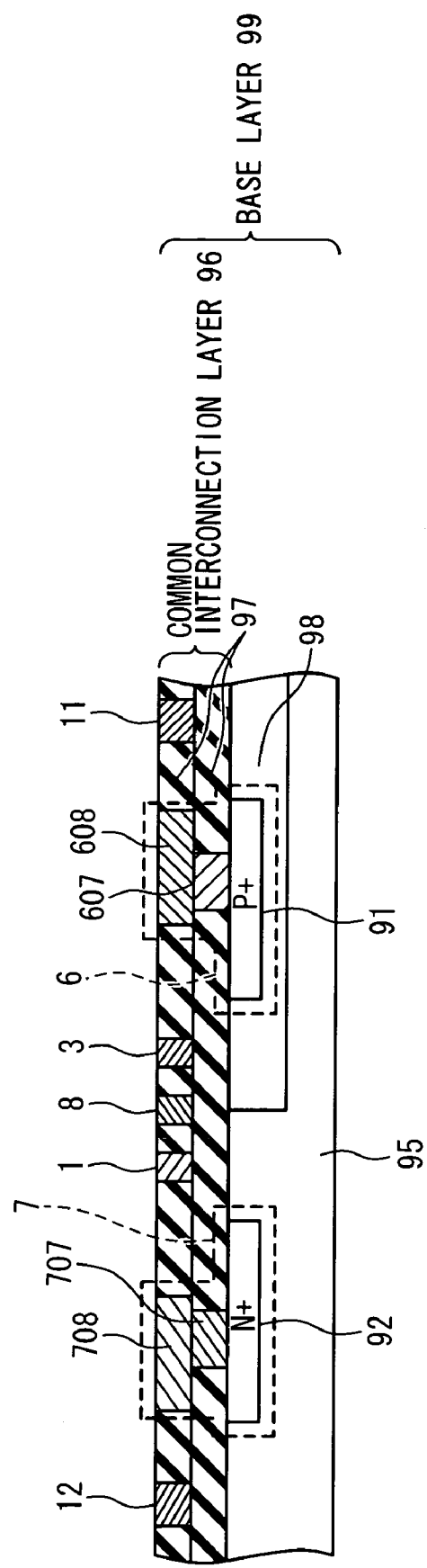

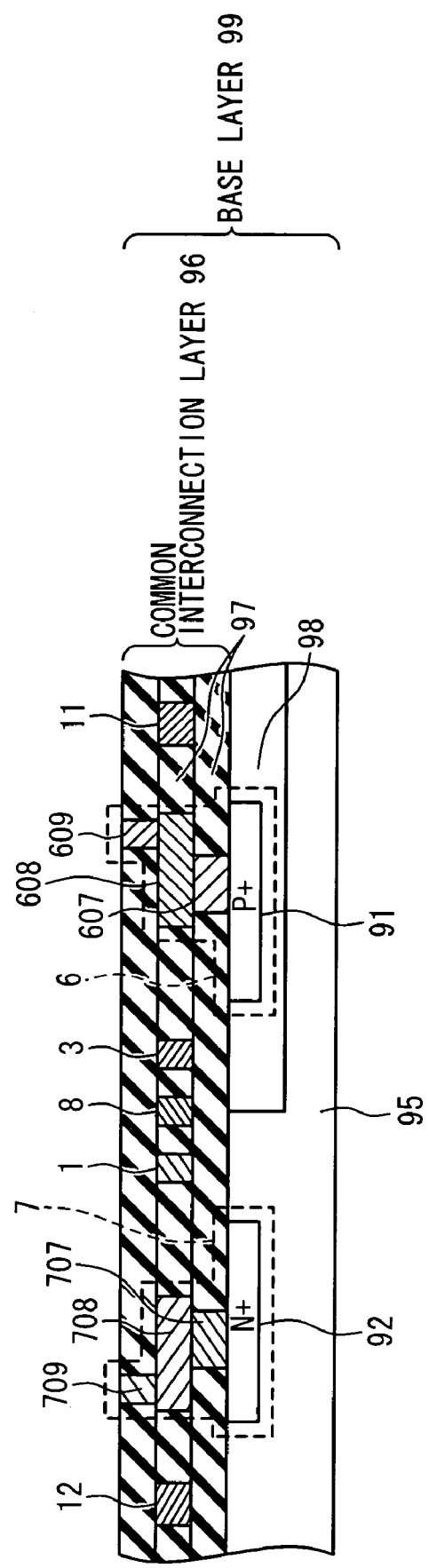

SEMICONDUCTOR DEVICE 70A

SEMICONDUCTOR DEVICE 70B

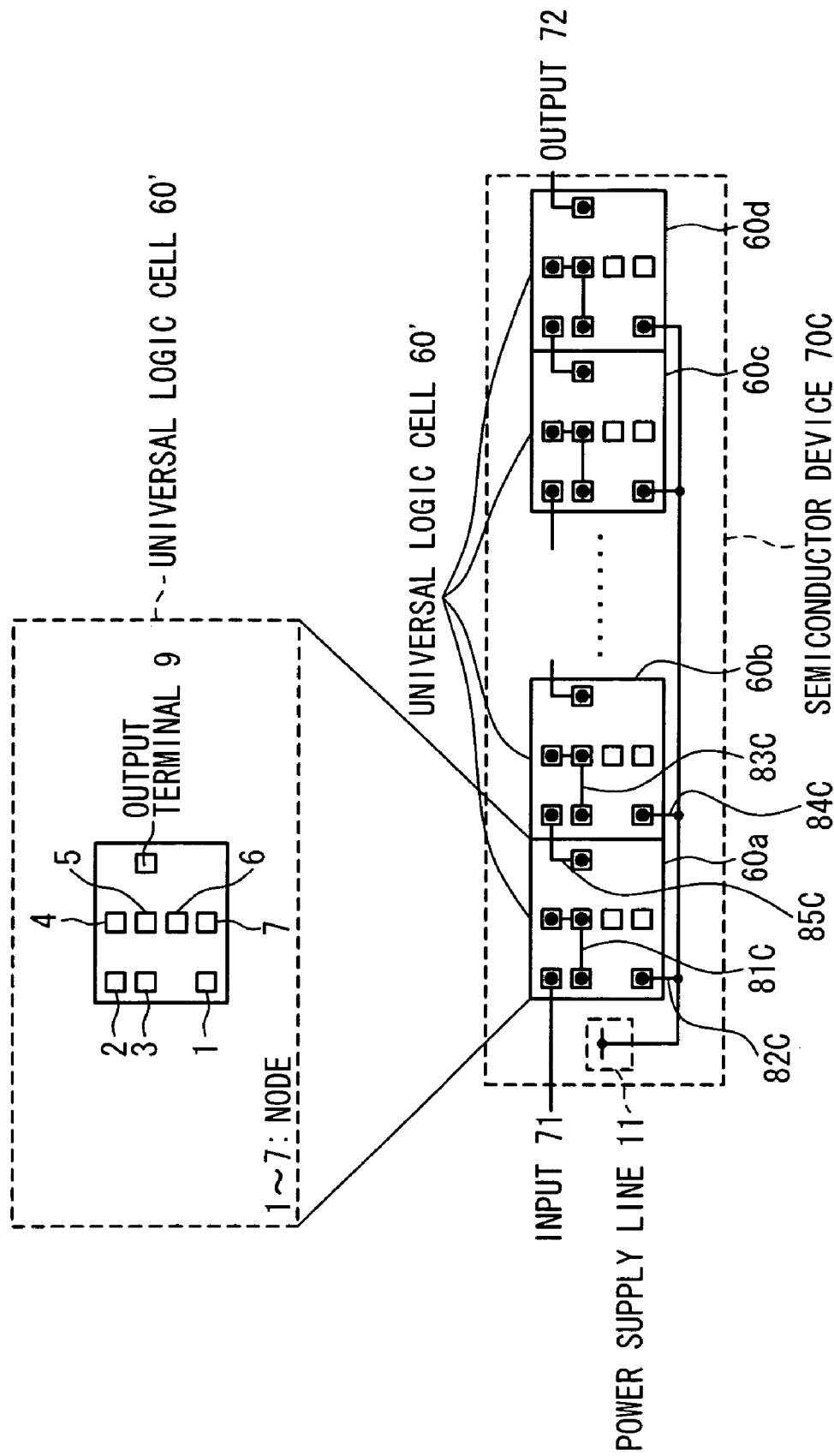

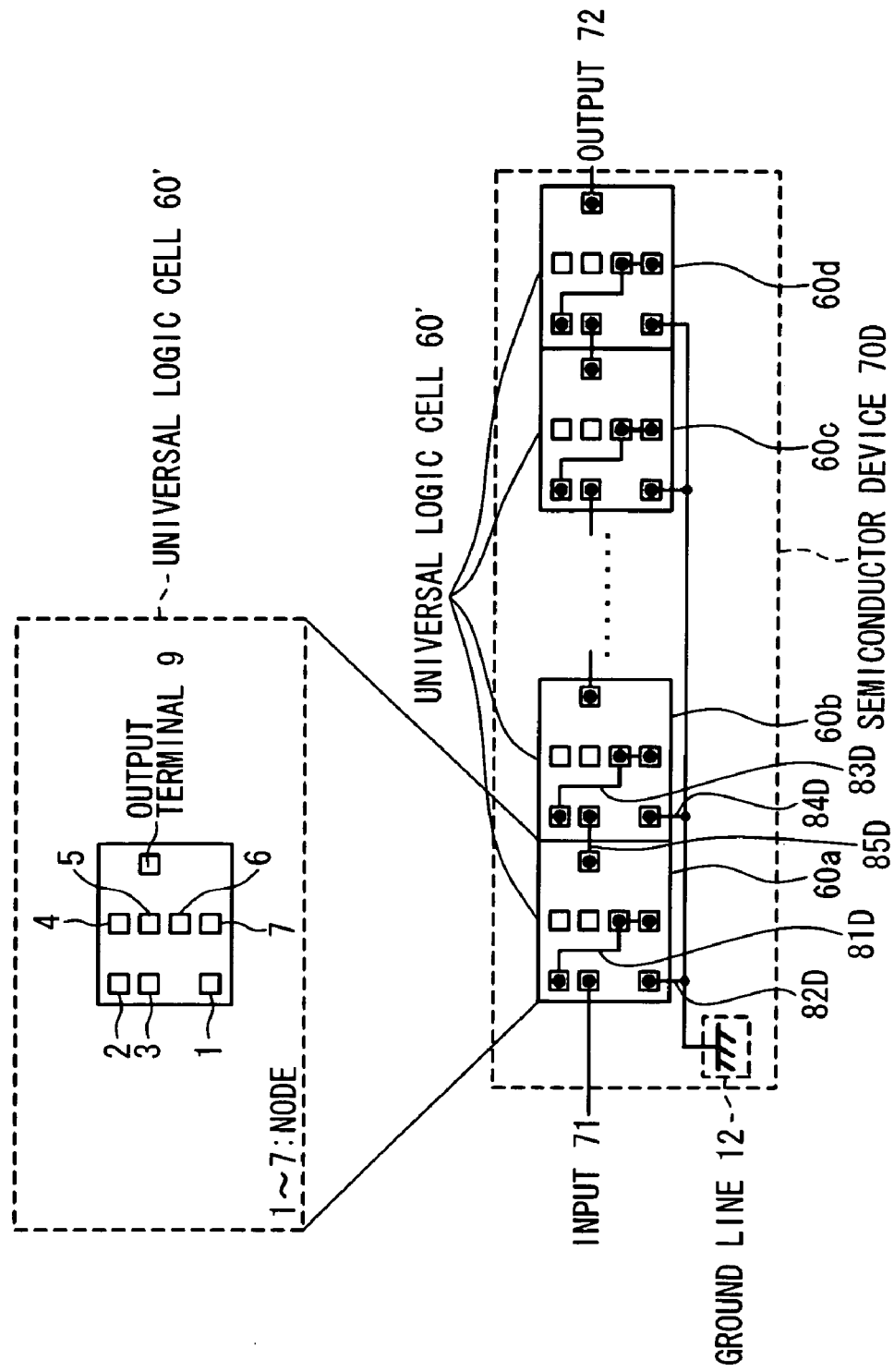

SEMICONDUCTOR DEVICE AND MANUFACTURING METHOD OF THE SAME

BACKGROUND OF THE INVENTION

1. Field of the Invention

The present invention relates to a semiconductor device. More particularly, the present invention relates to a universal logic cell, a semiconductor device using the universal logic cell, and a method of manufacturing the semiconductor device.

2. Description of the Related Art

A master slice method which is a semi-custom method is publicly known as one of conventional methods of developing a semiconductor device. As one type of the master slice method, a technique called "structured ASIC (Application Specific Integrated Circuit)" is proposed.

According to the structured ASIC, for example, three lower layers of all six interconnection layers are commonly utilized as "common interconnection layers", and the remaining three upper layers are provided as "customize interconnection layers". In the common interconnection layers as the lower layers, such components as interconnections and nodes between transistors, a power supply line, a ground line and the like are formed in advance. A multipurpose macro cell which includes the above-mentioned common interconnection layers and is formed on a chip beforehand is called a "universal logic cell". The universal logic cell includes not only a layer in which transistors are formed but also the common interconnection layers. In the universal logic cell, the nodes between transistors are particularly formed in a top layer of the above-mentioned common interconnection layers. This makes it possible to connect between these nodes arbitrarily with using interconnections in the customize interconnection layers provided on the common interconnection layers.

More specifically, a plurality of the universal logic cells having such structures are arranged on a chip in a matrix form. Then, in accordance with a desired circuit required by a customer, appropriate interconnections are designed in the customize interconnection layers which is the upper layers. This makes it possible to decrease TAT (Turn Around Time) and to reduce manufacturing costs. An important point in the structured ASIC is "flexibility of the universal logic cell" which is necessary for realizing the circuit required by the customer.

Japanese Laid Open Patent Application 2002-198801 discloses a technique which uses such a universal logic cell. The universal logic cell is a two-input multiplexer having three inverters, two transfer gates and a plurality of nodes. By appropriately connecting between some of the nodes, a NAND circuit, a NOR circuit, an EXOR circuit, or an EXNOR circuit is realized.

In developing the structured ASIC, it is also necessary to realize a "delay circuit" by using such a universal logic cell. The delay circuit is used, for example, to satisfy a setup condition and a hold condition with respect to a sequential circuit such as a flip-flop circuit. In particular, the longer delay time is required as a clock skew in a clock distribution interconnection becomes larger. For this reason, it is desired to realize a delay circuit capable of providing a sufficient delay time with the use of the universal logic cell and the customize interconnection layers. Here, it is preferable in terms of costs that the number of the universal logic cells used for realizing such a delay circuit is as small as possible. In other words, it is desired to realize a delay circuit with which longer delay time can be obtained with fewer universal logic cells, namely, an "efficient" delay circuit.

Japanese Patent Publication No. 2545461 discloses a configuration of a two-input multiplexer (an output selection circuit) of a typical conventional semiconductor device. The circuit is a complementary-type MOS circuit in which outputs of first and second inverters having complementary MOS configurations are wired-OR connected with outputs of first and second tristate circuits consisting of first and second transmission gates. Here, drains of respective of a P-channel MOS transistor and an N-channel MOS transistor of each of the first and second inverters are connected to sources or drains of respective of a P-channel MOS transistor and an N-channel MOS transistor of the corresponding one of the first and second transmission gates in the first and second tristate circuits. The drains of the P-channel MOS transistor and the N-channel MOS transistor of each of the first and second inverters are designed to be disconnected from each other. Also, the first and the second transmission gates are connected in common to a positive phase control signal line and a negative phase control signal line that is delayed from the former.

SUMMARY OF THE INVENTION

In the present invention, a universal logic cell includes an inverter, a first P-channel transistor, a second P-channel transistor, a first N-channel transistor, a second N-channel transistor, a first transfer gate, a second transfer gate, a third transfer gate and a fourth transfer gate.

An input of the inverter is connected to a first node. A gate, a source and a drain of the first P-channel transistor are connected to a second node, a power supply line and a fourth node, respectively. A gate, a source and a drain of the first N-channel transistor are connected to the second node, a ground line and a fifth node, respectively. A gate, a source and a drain of the second P-channel transistor are connected to a third node, the power supply line and a sixth node, respectively. A gate, a source and a drain of the second N-channel transistor are connected to the third node, the ground line and a seventh node, respectively. The first transfer gate includes a P-channel transistor whose gate is connected to the first node, and an input and an output of the first transfer gate are connected to the fourth node and an output terminal, respectively. The second transfer gate includes an N-channel transistor whose gate is connected to an output of the inverter, and an input and an output of the second transfer gate are connected to the fifth node and the output terminal, respectively. The third transfer gate includes a P-channel transistor whose gate is connected to an output of the inverter, and an input and an output of the third transfer gate are connected to the sixth node and the output terminal, respectively. The fourth transfer gate including an N-channel transistor whose gate is connected to the first node, and an input and an output of the fourth transfer gate are connected to the seventh node and the output terminal, respectively.

A semiconductor device has multi interconnection layers. The lower layers of the multi-interconnection layers are "common interconnection layers", which are allocated to the universal logic cell. On the other hand, the upper layers of the multi-interconnection layers are "customize interconnection layers", in which interconnections are formed in accordance with a desired LSI. For example, multi-interconnection layers consist of six interconnection layers, and the common interconnection layers and the customize interconnection layers consist of the lower three layers and the upper three layers of the six interconnection layers, respectively.

According to the present invention, at least a portion of an interconnection of each of the first node, the second node, the third node, the fourth node, the fifth node, the sixth node, the seventh node and the output terminal of the universal logic cell is formed in a top layer of the common interconnection layers. It is therefore possible to connect between the nodes arbitrarily by using the interconnections formed in the customize interconnection layers. By proving the universal logic cell (common interconnection layers) and designing appropriate interconnections in the customize interconnection layers, it is possible to develop a desired LSI, namely, a structured ASIC in a short period.

In an aspect of the present invention, a semiconductor device has a plurality of the above-mentioned universal logic cells, a power supply line, a ground line, a first interconnection and a second interconnection. The first interconnection connects the third node, the fourth node and the fifth node of a first universal logic cell of the plurality of universal logic cells. The second interconnection connects the power supply line and the first node of the first universal logic cell. The first interconnection and the second interconnection are formed in the customize interconnection layer provided on the common interconnection layers.

In the semiconductor device, the first transfer gate and the second transfer gate are turned off. Accordingly, a "delay circuit" is realized by the universal logic cell, the first interconnection and the second interconnection. Here, the source (or the drain) of the P-channel transistor of the third transfer gate is not connected to the source (or the drain) of the N-channel transistor of the fourth transfer gate. As a result, a larger resistance can be obtained, and hence a delay circuit providing a longer delay time can be designed. Therefore, the consumption of the universal logic cells is suppressed, and thus development cost is reduced. Moreover, electric power consumption due to the delay circuit is reduced, since the number of universal logic cells used is decreased. As described above, it is possible to realize a more efficient delay circuit by using the universal logic cell according to the present invention.

In another aspect of the present invention, a semiconductor device has a plurality of the above-mentioned universal logic cells, a power supply line, a ground line, a first interconnection and a second interconnection. The first interconnection connects the second node, the sixth node and the seventh node of a first universal logic cell of the plurality of universal logic cells. The second interconnection connects the ground line and the first node of the first universal logic cell. The first interconnection and the second interconnection are formed in the customize interconnection layer provided on the common interconnection layers.

In the semiconductor device, the third transfer gate and the fourth transfer gate are turned off. Accordingly, a "delay circuit" is realized by the universal logic cell, the first interconnection and the second interconnection. Here, the source (or the drain) of the P-channel transistor of the first transfer gate is not connected to the source (or the drain) of the N-channel transistor of the second transfer gate. As a result, a larger resistance can be obtained, and hence a delay circuit providing a longer delay time can be designed. Therefore, the consumption of the universal logic cells is suppressed, and thus development cost is reduced. Moreover, electric power consumption due to the delay circuit is reduced, since the number of universal logic cells used is decreased. As described above, it is possible to realize a more efficient delay circuit by using the universal logic cell according to the present invention.

In still another aspect of the present invention, a method of manufacturing a semiconductor device includes the steps of: (A) providing the above-mentioned universal logic cell; (B) connecting the third node, the fourth node and the fifth node over the top layer of the common interconnection layers, i.e., in the customize interconnection layers; and (C) connecting the power supply line and the first node in the customize interconnection layers. Or, a method of manufacturing a semiconductor device includes the steps of: (A) providing the above-mentioned universal logic cell; (B) connecting the second node, the sixth node and the seventh node over the top layer of the common interconnection layers, i.e., in the customize interconnection layers; and (C) connecting the ground line and the first node in the customize interconnection layers.

It is possible to realize an efficient delay circuit, according to the universal logic cell, the semiconductor device using the same, and the manufacturing method of the semiconductor device of the present invention.

The development costs can be reduced, according to the universal logic cell, the semiconductor device using the same, and the manufacturing method of the semiconductor device of the present invention.

The power consumption can be reduced, according to the semiconductor device using the universal logic cell of the present invention.

BRIEF DESCRIPTION OF THE DRAWINGS

The above and other objects, advantages and features of the present invention will be more apparent from the following description taken in conjunction with the accompanying drawings, in which:

FIG. 5B is a cross-sectional view along a line X–X' in FIG. 5A;

FIG. 6B is a cross-sectional view along a line X–X' in FIG. 6A;

FIG. 10 is a circuit diagram showing a configuration of a semiconductor device using the universal logic cell according to the fourth embodiment; and FIG. 11 is a circuit diagram showing a configuration of a semiconductor device using the universal logic cell according to the fifth embodiment.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

According to embodiments of the present invention, a "universal logic cell" is used for manufacturing a semiconductor device. The semiconductor device is, for example, a "structured ASIC". The universal logic cell, the semiconductor device using the universal logic cell and a method of manufacturing the semiconductor device will be described below with reference to the Drawings.

First Embodiment

Figure 1:
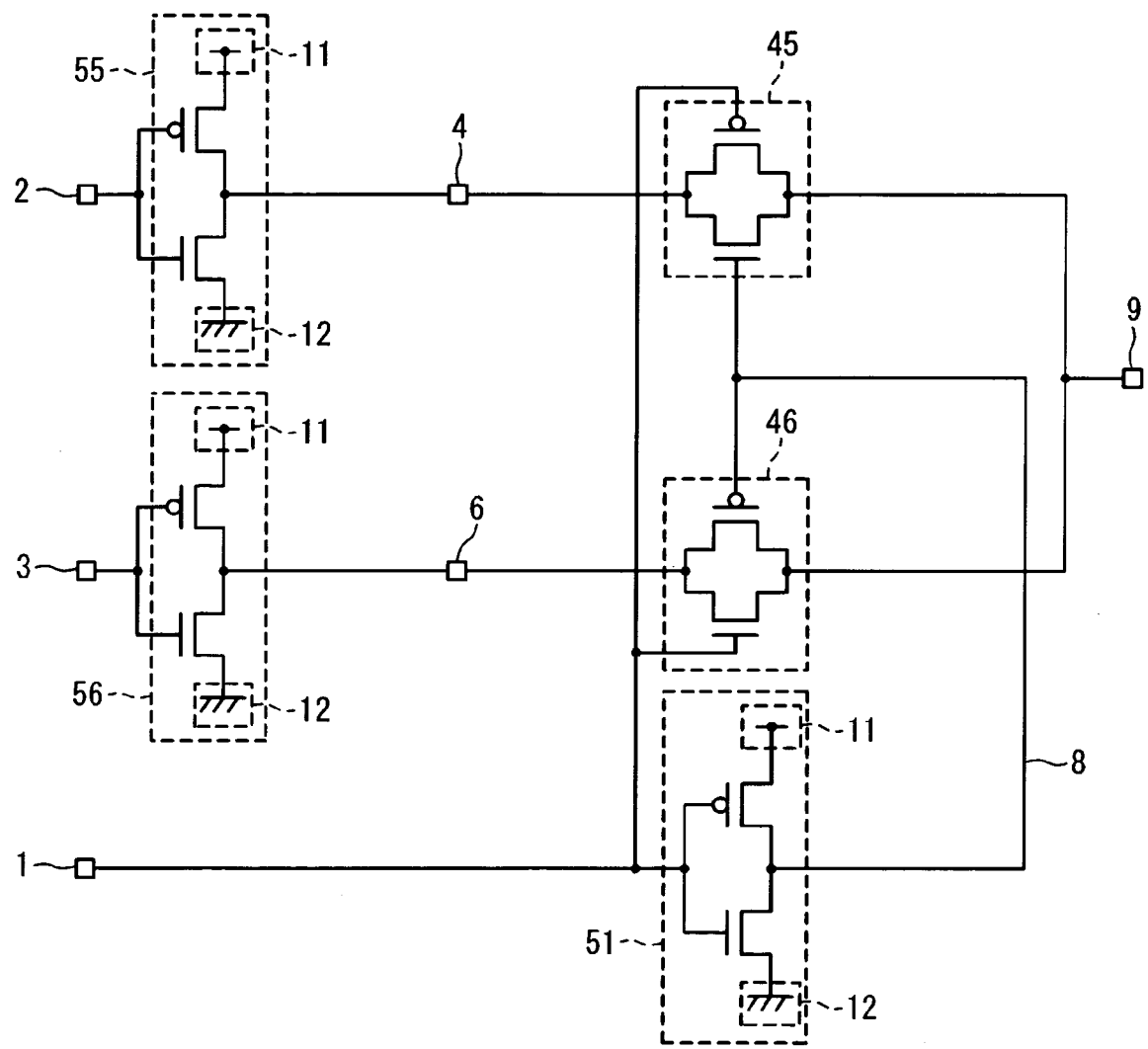
FIG. 1 is a circuit diagram showing a configuration of a universal logic cell according to a first embodiment of the present invention.

FIG. 1 is a circuit diagram showing a configuration of a universal logic cell 60 according to a first embodiment of the present invention. The universal logic cell 60 has a first inverter 55 and a second inverter 56 in a first stage, and a first transfer gate 45 and a second transfer gate 46 in a second stage. The first transfer gate 45 and the second transfer gate 46 are connected to an inverter 51. In other words, the universal logic cell 60 forms a two-input and output-inversion-type multiplexer (MUX).

The inverter 51 is an inverter of a general type, having a P-channel transistor connected to a power supply line 11 and an N-channel transistor connected to a ground line 12. Here, the power supply line 11 and the ground line 12 are interconnections to be used to apply power supply potential VDD and ground potential GND, respectively. An input and an output of the inverter 51 are connected to a node 1 and a node 8, respectively.

The first inverter 55 is also an inverter of a general type, having a P-channel transistor connected to the power supply line 11 and an N-channel transistor connected to the ground line 12. An input and an output of the first inverter 55 are connected to a node 2 and a node 4, respectively. The second inverter 56 is also an inverter of a general type, having a P-channel transistor connected to the power supply line 11 and an N-channel transistor connected to the ground line 12. An input and an output of the second inverter 56 are connected to a node 3 and a node 6, respectively.

The first transfer gate 45 has a P-channel transistor whose gate is connected to the node 1 and an N-channel transistor whose gate is connected to the node 8. An input and an output of the first inverter 45 are connected to the node 4 and an output terminal 9, respectively. Also, the second transfer gate 46 has a P-channel transistor whose gate is connected to the node 8 and an N-channel transistor whose gate is connected to the node 1. An input and an output of the second transfer gate 46 are connected to the node 6 and the output terminal 9, respectively.

The universal logic cell 60 as described above is manufactured beforehand on a chip together with the power supply line 11 and the ground line 12. In a general semiconductor device, the nodes 1 to 8 are formed in a diffusion layer, for example. However, in the universal logic cell 60 according to the present embodiment, interconnections (or a portion of each interconnection) constituting the nodes 1 to 8 and the output terminal 9 are formed in a top layer of a "common interconnection layers". The common interconnection layers consist of, for example, the lower three layers (lower layers) of six interconnection layers. In the remaining upper three layers as "customize interconnection layers", interconnections (user interconnections) connecting between the nodes are formed. By designing and providing appropriate user interconnections in the customize interconnection layers, it is possible to develop a desired LSI, namely, a structured ASIC in a short period.

Figure 2:
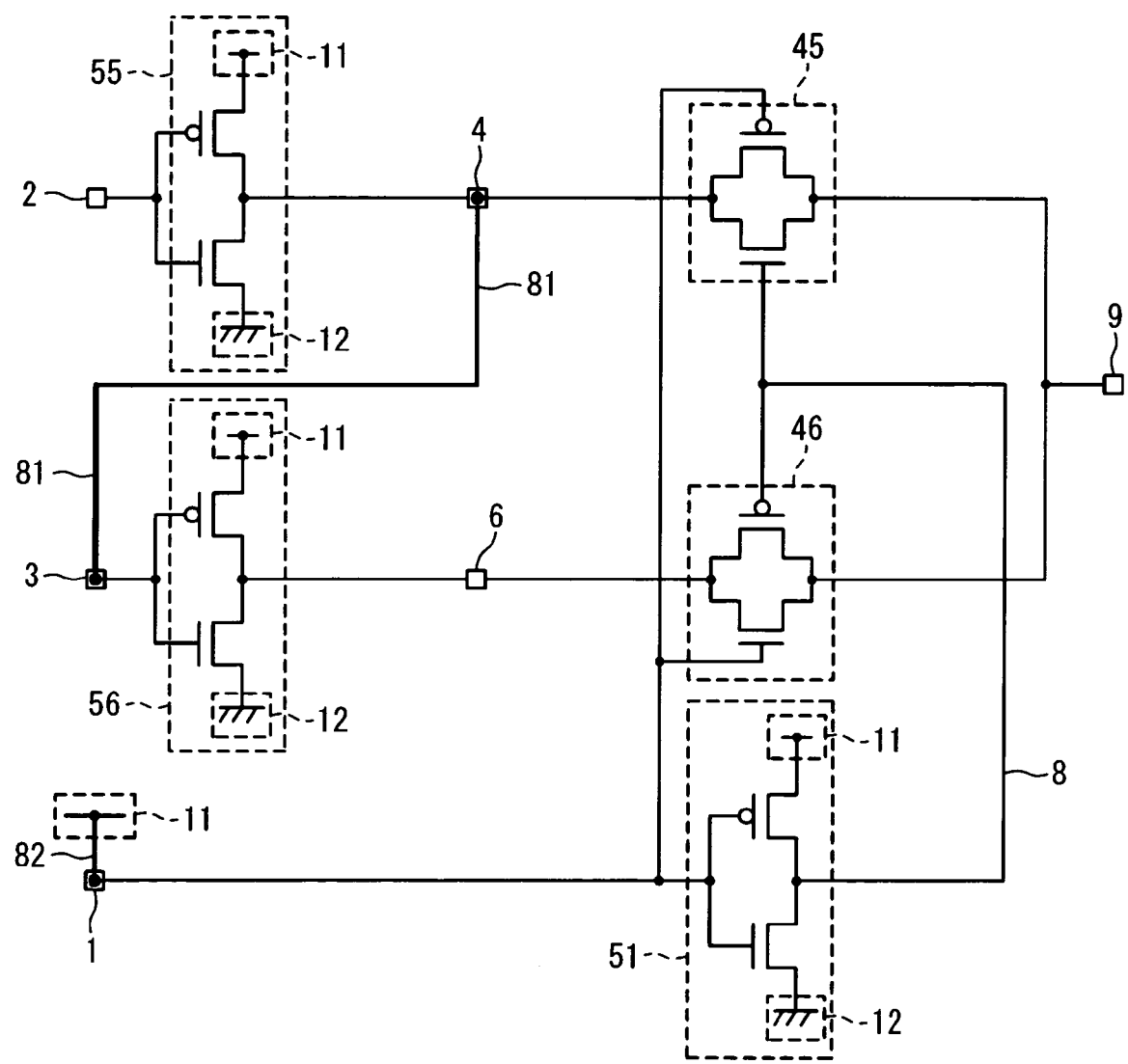
FIG. 2 is a circuit diagram showing a configuration of a semiconductor device using the universal logic cell according to the first embodiment.

FIG. 2 is a circuit diagram showing an example of a configuration of a semiconductor device 70 using the above-mentioned universal logic cell 60 according to the present embodiment. The semiconductor device 70 shown in FIG. 2 has a first interconnection 81 and a second interconnection 82 in addition to the universal logic cell 60 shown in FIG. 1. More specifically, the first interconnection 81 connects the node 4 and the node 3, and the second interconnection 82 connects the node 1 and the power supply line 11. These first interconnection 81 and the second interconnection 82 are formed in the customize interconnection layers on the common interconnection layers.

Since the node 1 is connected to the power supply line 11 and the power supply potential VDD is applied to the node 1, the first transfer gate 45 is turned OFF. As a result, a "delay circuit" is configured which connects the node 2 as an input terminal to the output terminal 9 through the first inverter 55, the node 4, the node 3, the second inverter 56, the node 6 and the second transfer gate 46. That is to say, the delay circuit is realized by using the universal logic cell 60 shown in FIG. 1 together with the first interconnection 81 and the second interconnection 82. In practice, a plurality of the universal logic cells 60 are prepared, and appropriate interconnections are applied to respective of the plurality of universal logic cells 60. Consequently, a desired LSI (structured ASIC) including the foregoing delay circuit is developed.

Figure 3:
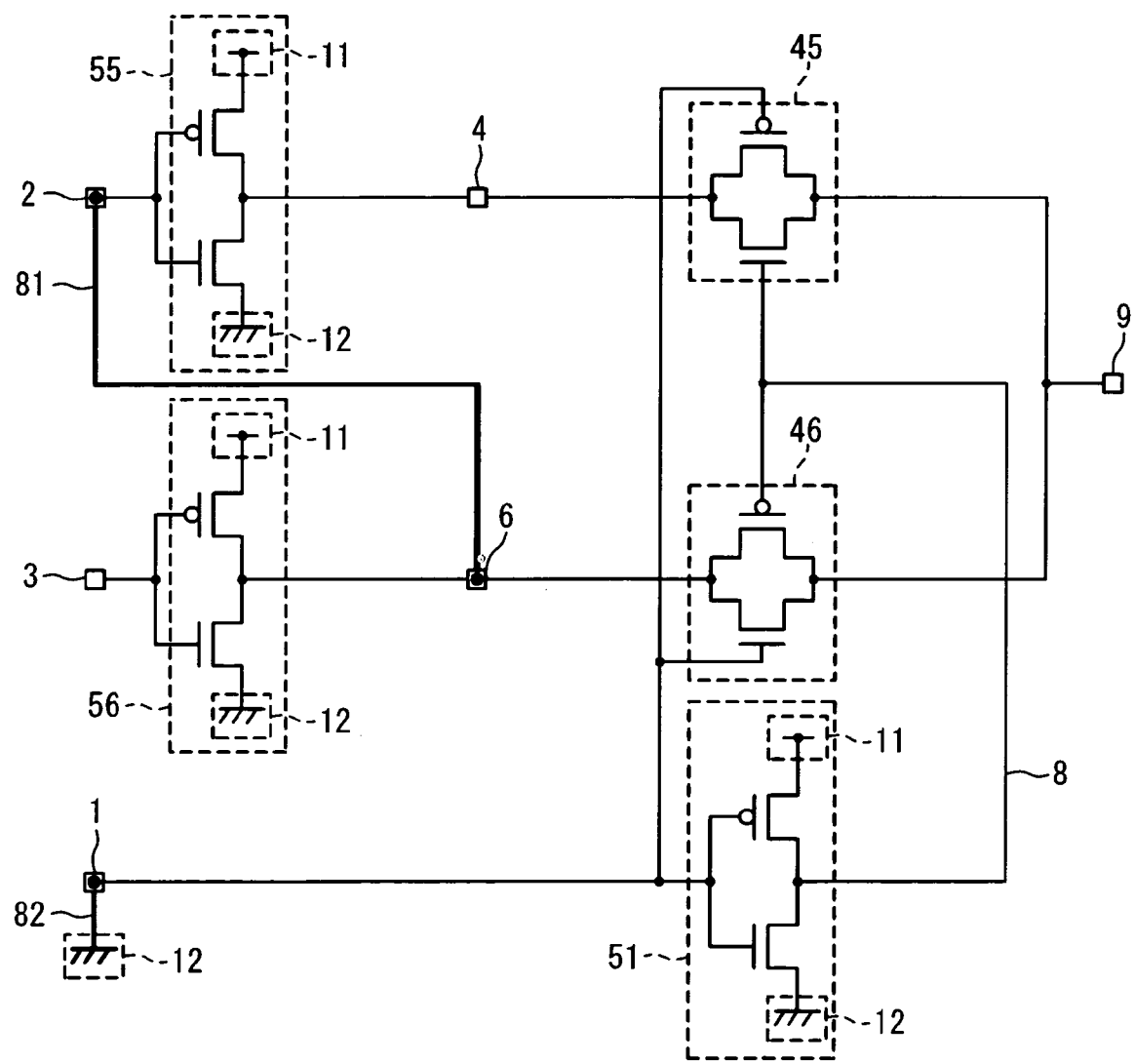
FIG. 3 is a circuit diagram showing a configuration of a semiconductor device using the universal logic cell according to the first embodiment.

FIG. 3 is a circuit diagram showing another example of a configuration of a semiconductor device 70 using the above-mentioned universal logic cell 60 according to the present embodiment. The semiconductor device 70 shown in FIG. 3 has a first interconnection 81 and a second interconnection 82 in addition to the universal logic cell 60 shown in FIG. 1. More specifically, the first interconnection 81 connects the node 2 and the node 6, and the second interconnection 82 connects the node 1 and the ground line 12. These first interconnection 81 and the second interconnection 82 are formed in the customize interconnection layers on the common interconnection layers.

Since the node 1 is connected to the ground line 12 and the ground potential GND is applied to the node 1, the second transfer gate 46 is turned OFF. As a result, a "delay circuit" is configured which connects the node 3 as an input terminal to the output terminal 9 through the second inverter 56, the node 6, the node 2, the first inverter 55, the node 4 and the first transfer gate 45. That is to say, the delay circuit is realized by using the universal logic cell 60 shown in FIG. 1 together with the first interconnection 81 and the second interconnection 82. In practice, a plurality of the universal logic cells 60 are prepared, and appropriate interconnections are applied to respective of the plurality of universal logic cells 60. Consequently, a desired LSI (structured ASIC) including the foregoing delay circuit is developed.

Other embodiments which can realize more "efficient" delay circuits as compared with the delay circuits shown in FIGS. 2 and 3 will be described below.

Second Embodiment

Figure 4:
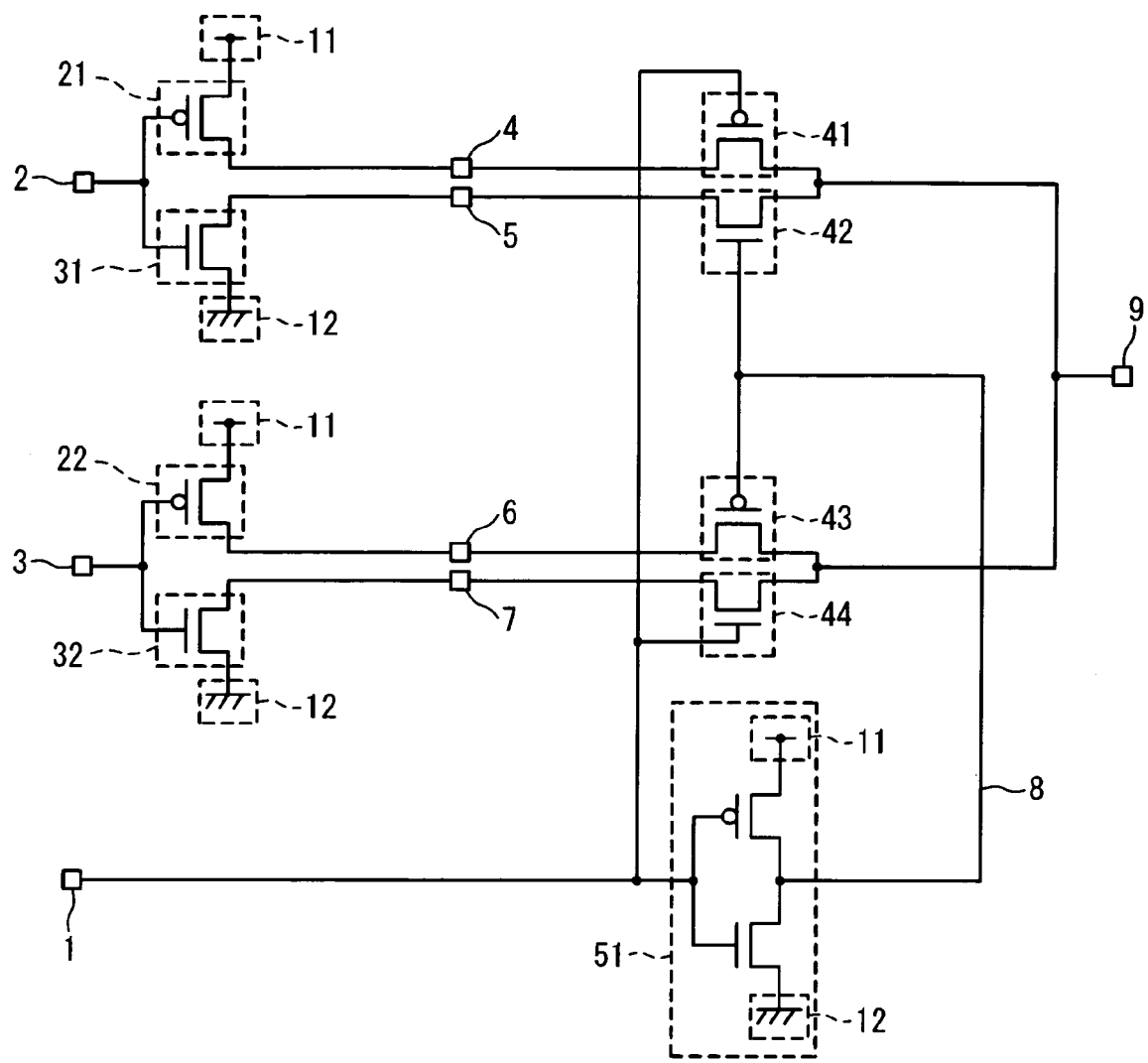
FIG. 4 is a circuit diagram showing a configuration of a universal logic cell according to a second embodiment of the present invention.

FIG. 4 is a circuit diagram showing a configuration of a universal logic cell 60' according to a second embodiment of the present invention. The universal logic cell 60' includes P-channel transistors 21 and 22, N-channel transistors 31 and 32, transfer gates 41 to 44, and an inverter 51.

The inverter 51 is an inverter of a general type, having a P-channel transistor connected to a power supply line 11 and an N-channel transistor connected to a ground line 12. Here, the power supply line 11 and the ground line 12 are interconnections to be used to apply the power supply potential VDD and the ground potential GND, respectively. An input and an output of the inverter 51 are connected to a node 1 and a node 8, respectively.

A gate, a source and a drain of the P-channel transistor 21 are connected to a node 2, the power supply line 11 and a node 4, respectively. Also, a gate, a source and a drain of the N-channel transistor 31 are connected to the node 2, the ground line 12 and a node 5, respectively. Thus, the drain of the P-channel transistor 21 is disconnected from the drain of the N-channel transistor 31.

A gate, a source and a drain of the P-channel transistor 22 are connected to a node 3, the power supply line 11 and a node 6, respectively. A gate, a source and a drain of the N-channel transistor 32 are connected to the node 3, the ground line 12 and a node 7, respectively. Thus, the drain of the P-channel transistor 22 is disconnected from the drain of the N-channel transistor 32.

The transfer gate 41 includes a P-channel transistor. A gate of the P-channel transistor is connected to the node 1. One of a source and a drain of the P-channel transistor is connected to the node 4, and the other is connected to an output terminal 9. That is, an input and an output of the transfer gate 41 are connected to the node 4 and the output terminal 9, respectively.

Also, the transfer gate 42 includes an N-channel transistor. A gate of the N-channel transistor is connected to the node 8, namely to the node 1 through the inverter 51. One of a source and a drain of the N-channel transistor is connected to the node 5, and the other is connected to the output terminal 9. That is, an input and an output of the transfer gate 42 are connected to the node 5 and the output terminal 9, respectively.

Also, the transfer gate 43 includes a P-channel transistor. A gate of the P-channel transistor is connected to the node 8, namely to the node 1 through the inverter 51. One of a source and a drain of the P-channel transistor is connected to the node 6, and the other is connected to the output terminal 9. In other words, an input and an output of the transfer gate 43 are connected to the node 6 and the output terminal 9, respectively.

Also, the transfer gate 44 includes an N-channel transistor. A gate of the N-channel transistor is connected to the node 1. One of a source and a drain of the N-channel transistor is connected to the node 7, and the other is connected to the output terminal 9. In other words, an input and an output of the transfer gate 44 are connected to the node 7 and the output terminal 9, respectively.

In this manner, the node 2 is connected to the output terminal 9 through the P-channel transistor 21, the node 4 and the transfer gate 41. Moreover, the node 2 is connected to the output terminal 9 through the N-channel transistor 31, the node 5 and the transfer gate 42. Also, the node 3 is connected to the output terminal 9 through the P-channel transistor 22, the node 6 and the transfer gate 43. Moreover, the node 3 is connected to the output terminal 9 through the N-channel transistor 32, the node 7 and the transfer gate 44. In a normal state, the above-mentioned universal logic cell 60' forms a two-input and output-inversion-type multiplexer (MUX).

Figure 5A:
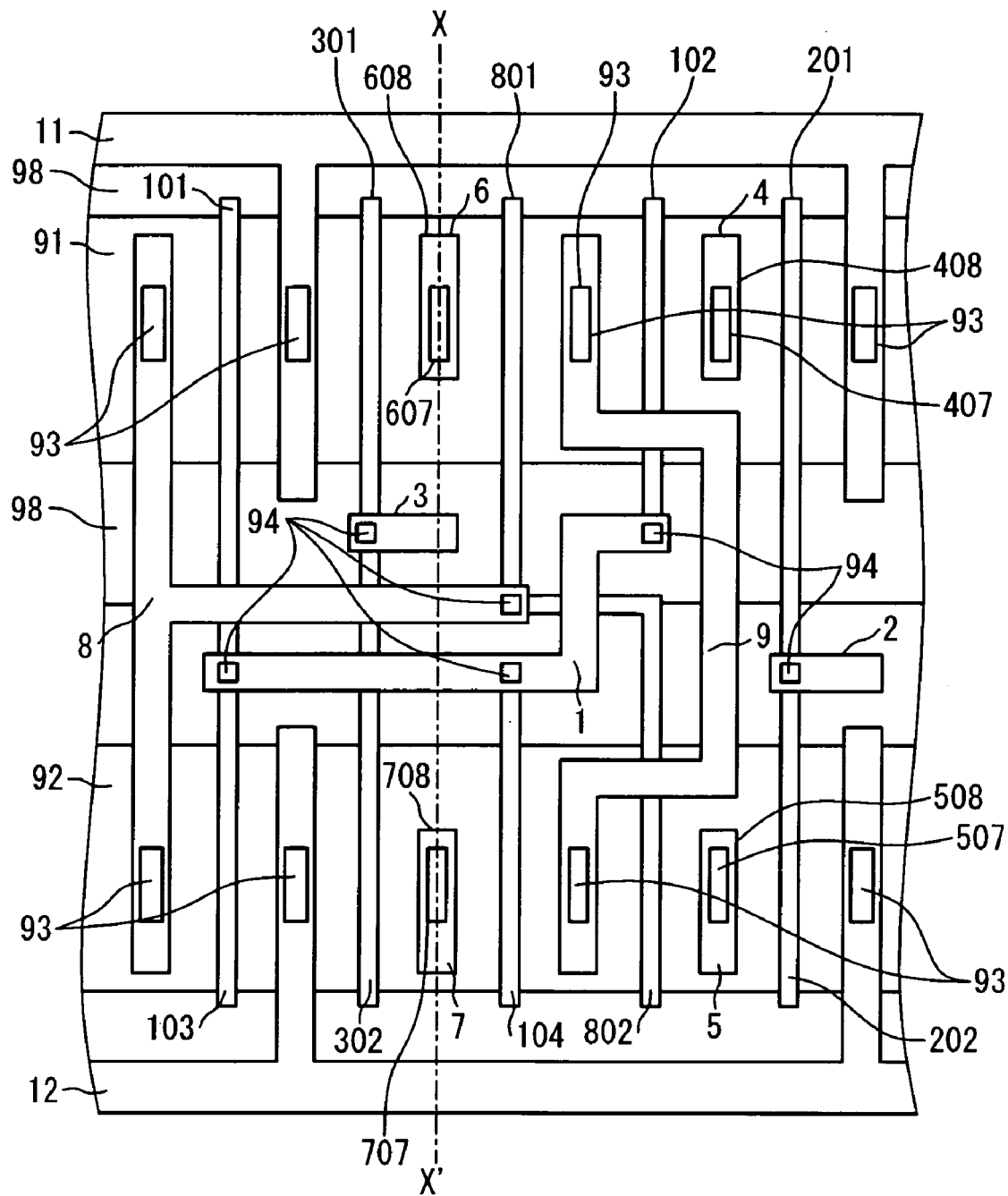
FIG. 5A is a plan view showing an example of a structure of the universal logic cell according to the second embodiment.

FIG. 5A is a plan view showing an example of a structure of the universal logic cell 60' shown in FIG. 4. FIG. 5B is a cross-sectional view along a line X–X' in FIG. 5A. As shown in FIGS. 5A and 5B, for example, an N-type diffusion layer 92 is formed in a substrate 95 made of P-type silicon, and a P-type diffusion layer 91 is formed in an N well 98 formed in the substrate 95.

The node 1 is connected through a gate contact 94 to gate polysilicon 101 and 103 forming the inverter 51. The node 1 is also connected through gate contacts 94 to a gate polysilicon 102 forming the transfer gate 41 and to a gate polysilicon 104 forming the transfer gate 44. One of the source and the drain (the P-type diffusion layer 91) of the transfer gate 41 is connected to the output terminal 9 through a contact 93, and the other is connected through a contact 407 to an interconnection 408 forming the node 4. Also, one of the source and the drain (the N-type diffusion layer 92) of the transfer gate 44 is connected to the output terminal 9 through a contact 93, and the other is connected through a contact 707 to an interconnection 708 forming the node 7.

The node 2 is connected through gate contacts 94 to a gate polysilicon 201 forming the P-channel transistor 21 and to a gate polysilicon 202 forming the N-channel transistor 31. The source of the P-channel transistor 21 (the P-type diffusion layer 91) is connected to the power supply line 11 through a contact 93, and the drain thereof (the P-type diffusion layer 91) is connected through a contact 407 to the interconnection 408 forming the node 4. Also, the source of the N-channel transistor 31 (the N-type diffusion layer 92) is connected to the ground line 12 through a contact 93, and the drain thereof (the N-type diffusion layer 92) is connected through a contact 507 to an interconnection 508 forming the node 5.

The node 3 is connected through gate contacts 94 to a gate polysilicon 301 forming the P-channel transistor 22 and to a gate polysilicon 302 forming the N-channel transistor 32. The source of the P-channel transistor 22 (the P-type diffusion layer 91) is connected to the power supply line 11 through a contact 93, and the drain thereof (the P-type diffusion layer 91) is connected through a contact 607 to an interconnection 608 forming the node 6. Also, the source of the N-channel transistor 32 (the N-type diffusion layer 92) is connected to the ground line 12 through a contact 93, and the drain thereof (the N-type diffusion layer 92) is connected through a contact 707 to the interconnection 708 forming the node 7.

The node 8 is connected through contacts 93 to the diffusion layers 91 and 92 forming the inverter 51, and is connected through gate contacts 94 to a gate polysilicon 801 forming the transfer gate 43 and a gate polysilicon 802 forming the transfer gate 42. One of the source and the drain (the P-type diffusion layer 91) of the transfer gate 43 is connected to the output terminal 9 through a contact 93, and the other is connected through a contact 607 to the interconnection 608 forming the node 6. Also, one of the source and the drain (the N-type diffusion layer 92) of the transfer gate 42 is connected to the output terminal 9 through a contact 93, and the other is connected through a contact 507 to the interconnection 508 forming the node 5.

In FIG. 5B, the interconnection 608 is connected to the P-type diffusion layer 91 through the contact 607, and the node 6 is constituted by the P-type diffusion layer 91, the contact 607 and the interconnection 608. Also, the interconnection 708 is connected to the N-type diffusion layer 92 through the contact 707, and the node 7 is constituted by the N-type diffusion layer 92, the contact 707 and the interconnection 708. An insulating film 97 is formed to surround the interconnections and the contacts. The same is applied to the other nodes (1 to 8). The universal logic cell 60' is thus formed on a chip together with the power supply line 11 and the ground line 12, and thus a base layer 99 is prepared in advance. The base layer 99 includes not only the common interconnection layers 96 but also the substrate 95 in which the diffusion layers 91, 92, the N-well 98 and the like are formed.

In a typical semiconductor device, such the nodes 1 to 8 are formed, for example, in a diffusion layer. However, according to the present embodiment as shown in FIG. 5B, an entire of a portion of the interconnection forming each of the nodes 1 to 8 is formed in a top layer of common interconnection layers 96 in the base layer 99. The output terminal 9, the power supply line 11 and the ground line 12 are also formed in the top layer of the common interconnection layers 96. As a result, it is possible to connect between the nodes freely over the common interconnection layers 96. The common interconnection layers 96 are formed of, for example, the lower three layers (lower layers) of six interconnection layers. The remaining three upper layers are the customize interconnection layers, in which interconnections connecting between the nodes (user interconnections) are formed. By designing and providing appropriate user interconnections in the customize interconnection layers, it is possible to develop a desired LSI, namely a structured ASIC in a short period.

Figure 6A:
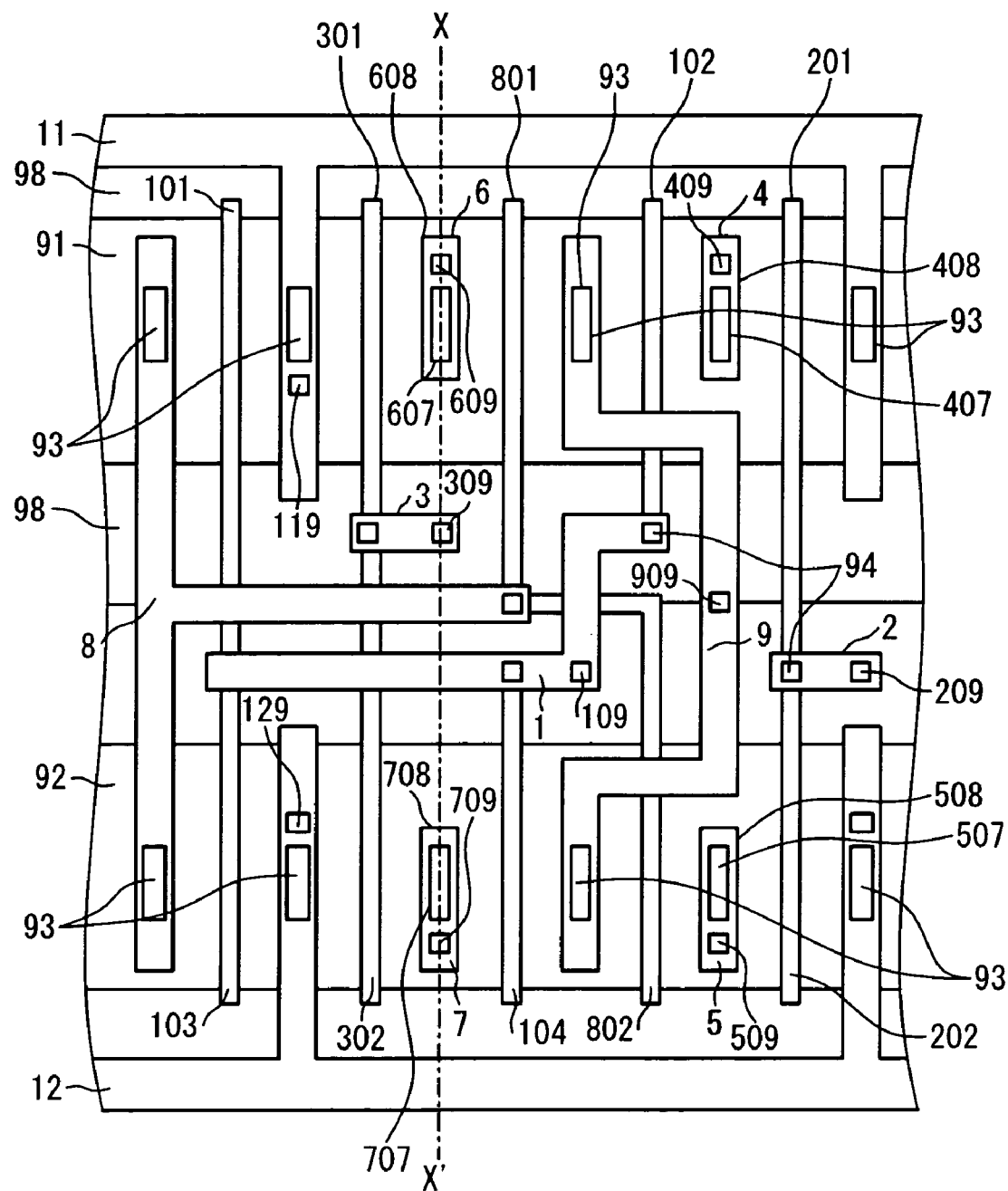
FIG. 6A is a plan view showing another example of a structure of the universal logic cell according to the second embodiment.

FIG. 6A is a plan view showing another example of a structure of the universal logic cell 60' shown in FIG. 4. FIG. 6B is a cross-sectional view along a line X–X' in FIG. 6A. In FIGS. 6A and 6B, the same reference numerals as in FIGS. 5A and 5B are given to structures identical to those shown in FIGS. 5A and 5B, and description thereof is properly omitted.

In FIG. 6A, via holes 109 to 709 are formed, respective of which are connected to the nodes 1 to 7. Additionally, a via hole 909 connected to the output terminal 9 is formed. Further, via holes 119 and 129 are formed, respective of which are connected to the power supply line 11 and the ground line 12. As shown in FIG. 6B, these via holes (109 to 709, 909, 119, and 129) are formed in the top layer of the common interconnection layers 96. By forming interconnections (user interconnections) in the customize interconnection layers which connect between the exposed via holes in accordance with a desired circuit, a developer can develop the structured ASIC.

Figure 7:
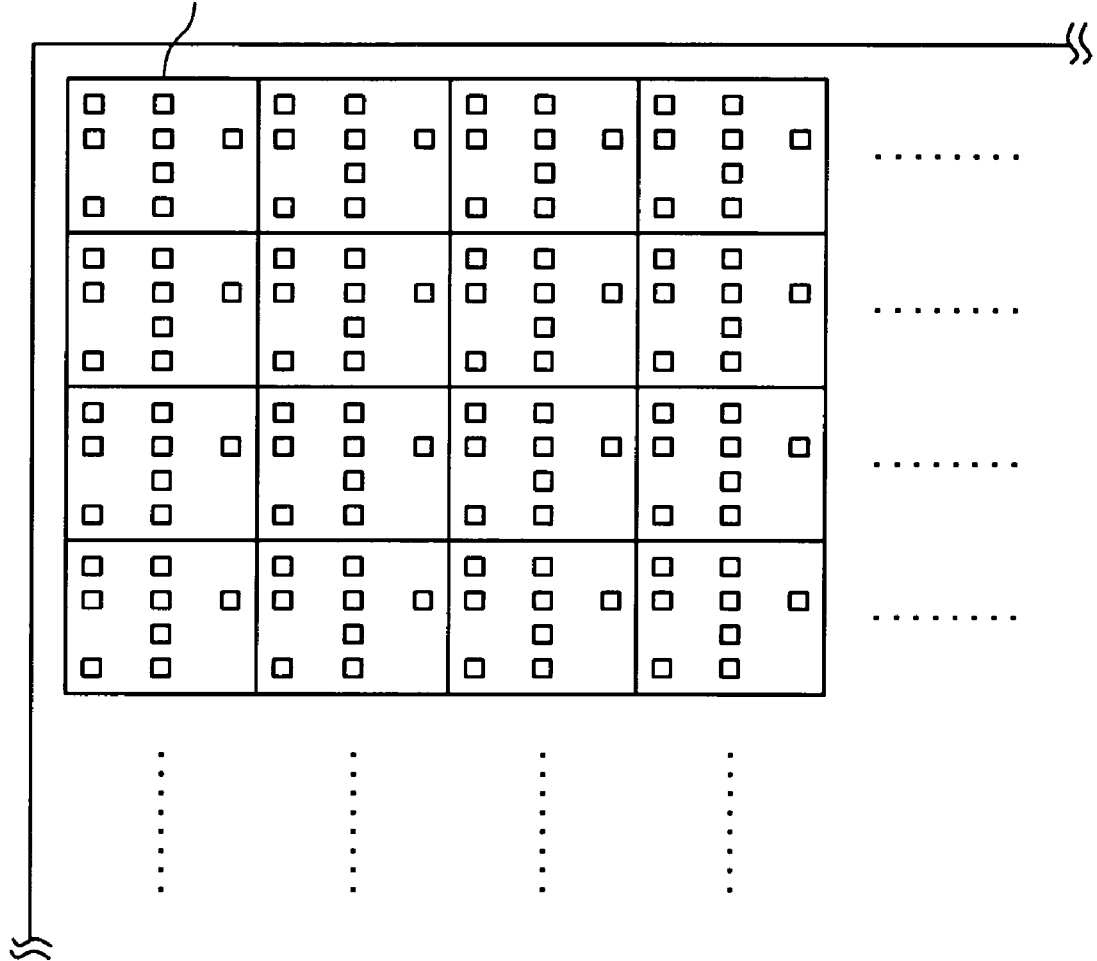
FIG. 7 is a schematic diagram showing a layout of the universal logic cells according to the present invention.

In developing the structured ASIC, a plurality of the universal logic cells 60' as described above are used. Each of the plurality of the universal logic cells 60' has the same structure as that described above. FIG. 7 is a schematic diagram showing a layout of the plurality of universal logic cells 60' according to the present embodiment. As shown in FIG. 7, the plurality of the universal logic cells 60' are arranged in a matrix, for instance. The power supply line 11 and the ground line 12 (not shown) are connected in common to the plurality of the universal logic cells 60'. By connecting between the nodes 1 to 8 and the output terminal 9 of the plurality of the universal logic cells 60' with using appropriate interconnections in the customize interconnection layers, a delay circuit, a flip-flop circuit and the like are formed, and hence a structured ASIC (a semiconductor device) is configured. A configuration and a manufacturing method of such a semiconductor device are described below. In particular, a portion associated with a "delay circuit" in the semiconductor device will be described below.

Figure 8:
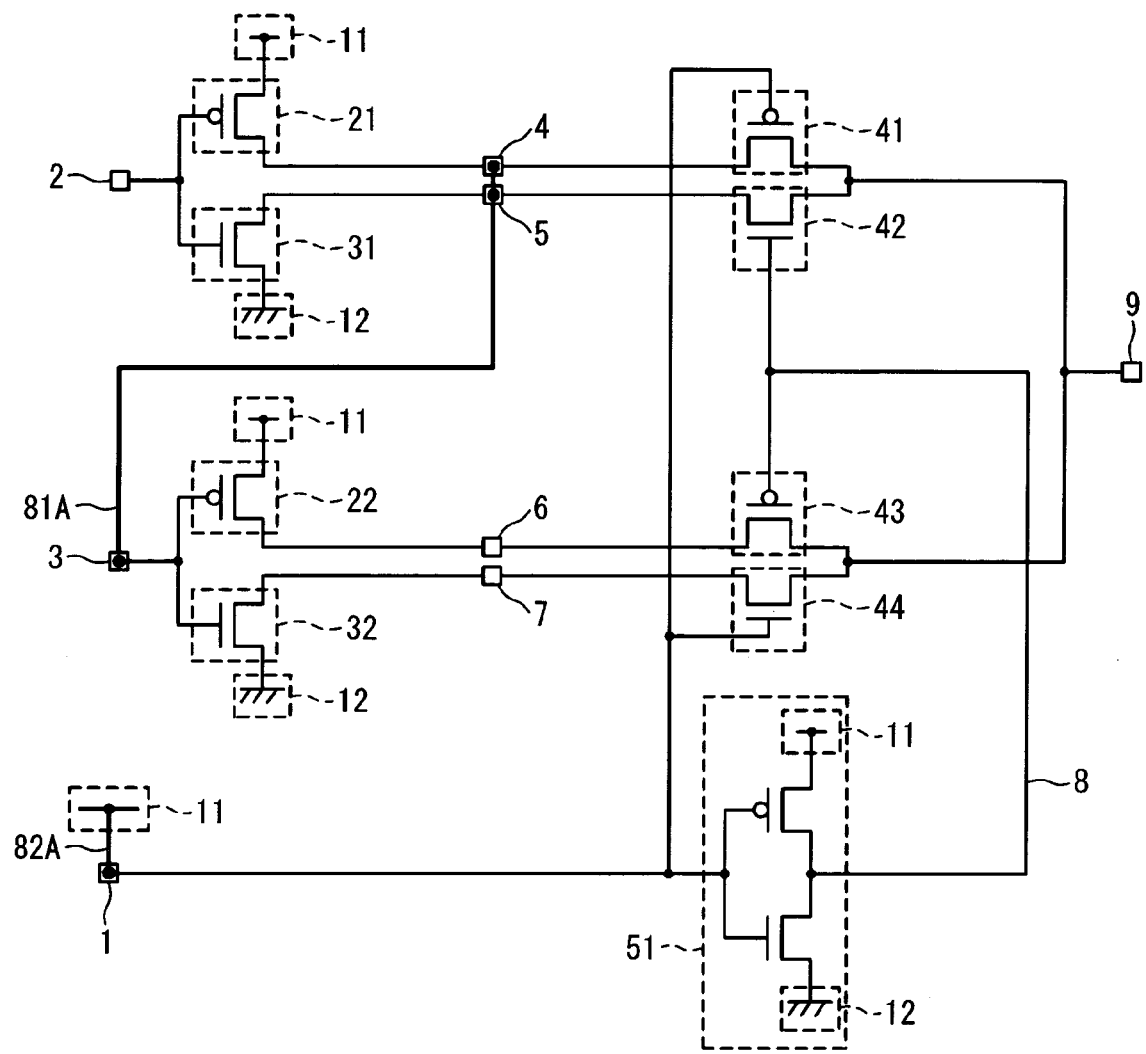
FIG. 8 is a circuit diagram showing a configuration of a semiconductor device using the universal logic cell according to the second embodiment.

FIG. 8 is a circuit diagram showing a configuration of a semiconductor device 70A using the above-mentioned universal logic cell 60' according to the present embodiment. The semiconductor device 70A shown in FIG. 8 has a first interconnection 81A and a second interconnection 82A in addition to the universal logic cell 60' shown in FIG. 4. The first interconnection 81A and the second interconnection 82A are formed in the above-mentioned customize interconnection layers, and are connected with the exposed nodes and the power supply line 11. More specifically, the first interconnection 81A connects the node 4, the node 5 and the node 3, while the second interconnection 82A connects the node 1 and the power supply line 11. A method of manufacturing the semiconductor device 70A has the following steps: (A) a step of providing the universal logic cell 60' shown in FIG. 4; (B) a step of forming the first interconnection 81A connecting the node 4, the node 5 and the node 3 in the customize interconnection layers; and (C) a step of forming the second interconnection 82A connecting the node 1 and the power supply line 11 in the customize interconnection layers.

Effects of the semiconductor device 70A using the universal logic cell 60' and the manufacturing method of the semiconductor device 70A according to the present embodiment are as follows.

Since the node 1 is connected to the power supply line 11 and the power supply potential VDD is applied to the node 1, the transfer gates 41 and 42 are turned OFF. As a result, a "delay circuit" is configured, in which the node 2 as an input terminal is connected to the output terminal 9 through the P-channel transistor 21/the N-channel transistor 31, the node 4/the node 5, the node 3, the P-channel transistor 22/the N-channel transistor 32, the node 6/the node 7, and the transfer gate 43/the transfer gate 44. That is to say, a delay circuit is realized by using the universal logic cell 60' shown in FIG. 4 together with the first interconnection 81A and the second interconnection 82A.

Here, since the source (or the drain) of the transfer gate 43 is disconnected from the source (or the drain) of the transfer gate 44, resistance due to the transfer gate 43 and the transfer gate 44 in the present embodiment is substantially larger than the resistance due to the second transfer gate 46 shown in FIG. 2. In other words, a delay circuit providing a further longer delay time as compared with the delay circuit shown in FIG. 2 can be produced. A delay circuit having a longer delay time can be realized by using one universal logic cell 60', which means reduction in the number of the universal logic cells 60' that are allocated to the making of the delay circuit among the plurality of the universal logic cells 60' shown in FIG. 7. Accordingly, consumption of the universal logic cells 60' can be suppressed, and thus development costs can be reduced. Furthermore, electric power consumption due to the delay circuit is reduced, since the number of the universal logic cells 60' used is decreased. According to the present embodiment, as described above, it is possible to realize a more efficient delay circuit with the use of the universal logic cell 60' shown in FIGS. 4 to 7, and to develop the semiconductor device 70A having such the delay circuit.

Third Embodiment

In a third embodiment of the present invention, the universal logic cell 60' shown in FIGS. 4 to 7 is used as in the above-mentioned second embodiment. Therefore, description regarding the universal logic cell 60' is omitted.

Figure 9:
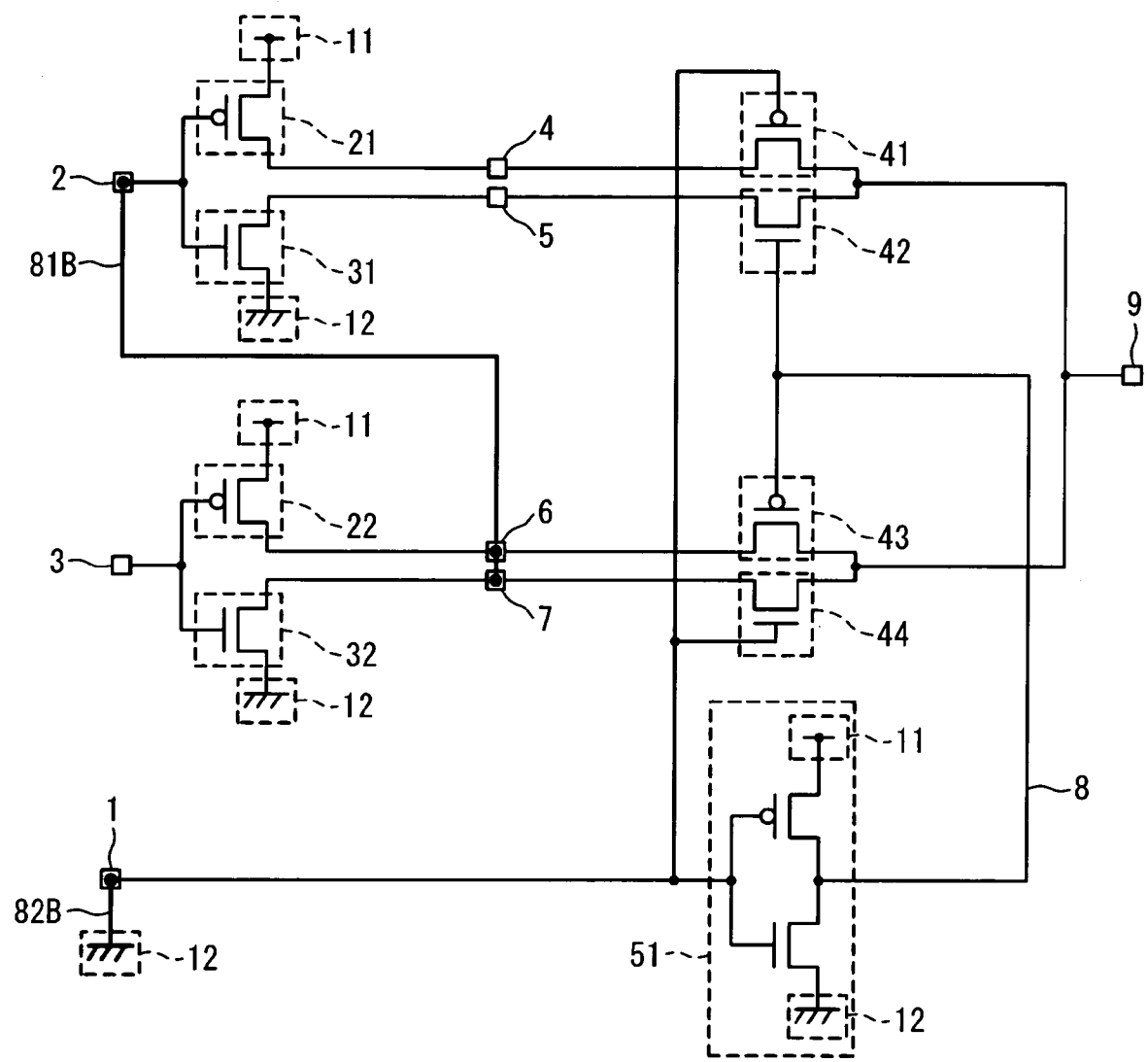
FIG. 9 is a circuit diagram showing a configuration of a semiconductor device using the universal logic cell according to the third embodiment.

FIG. 9 is a circuit diagram showing a configuration of a semiconductor device 70B using the above-mentioned universal logic cell 60' according to the present embodiment. The semiconductor device 70B shown in FIG. 9 has a first interconnection 81B and a second interconnection 82B in addition to the universal logic cell 60' shown in FIG. 4. The first interconnection 81B and the second interconnection 82B are formed in the above-mentioned customize interconnection layers, and are connected with the exposed nodes and the ground line 12. More specifically, the first interconnection 81B connects the node 6, the node 7 and the node 2, while the second interconnection 82B connects the node 1 and the ground line 12. A method of manufacturing the semiconductor device 70B has the following steps: (A) a step of providing the universal logic cell 60' shown in FIG. 4; (B) a step of forming the first interconnection 81B connecting the node 6, the node 7 and the node 2 in the customize interconnection layers; and (C) a step of forming the second interconnection 82B connecting the node 1 and the ground line 12 in the customize interconnection layers.

Effects of the semiconductor device 70B using the universal logic cell 60' and the manufacturing method of the semiconductor device 70B according to the present embodiment are as follows.

Since the node 1 is connected to the ground line 12 and the ground potential GND is applied to the node 1, the transfer gates 43 and 44 are turned OFF. As a result, a "delay circuit" is configured, in which the node 3 as an input terminal is connected to the output terminal 9 through the P-channel transistor 22/the N-channel transistor 32, the node 6/the node 7, the node 2, the P-channel transistor 21/the N-channel transistor 31, the node 4/the node 5, and the transfer gate 41/the transfer gate 42. That is to say, a delay circuit is realized by using the universal logic cell 60' shown in FIG. 4 together with the first interconnection 81B and the second interconnection 82B.

Here, since the source (or the drain) of the transfer gate 41 is disconnected from the source (or the drain) of the transfer gate 42, resistance due to the transfer gate 41 and the transfer gate 42 in the present embodiment is substantially larger than the resistance due to the first transfer gate 45 shown in FIG. 3. In other words, a delay circuit providing a further longer delay time as compared with the delay circuit shown in FIG. 3 can be produced. A delay circuit having a longer delay time can be realized by using one universal logic cell 60', which means reduction in the number of the universal logic cells 60' that are allocated to the making of the delay circuit among the plurality of the universal logic cells 60' shown in FIG. 7. Accordingly, consumption of the universal logic cells 60' can be suppressed, and thus development costs can be reduced. Furthermore, electric power consumption due to the delay circuit is reduced, since the number of the universal logic cells 60' used is decreased. According to the present embodiment, as described above, it is possible to realize a more efficient delay circuit with the use of the universal logic cell 60' shown in FIGS. 4 to 7, and to develop the semiconductor device 70B having such the delay circuit.

Fourth Embodiment

In a fourth embodiment of the present invention, the universal logic cell 60' shown in FIGS. 4 to 7 is used as in the foregoing embodiments. Therefore, description regarding the universal logic cell 60' is omitted. According to the present embodiment, a predetermined number of the universal logic cells 60' among the plurality of the universal logic cells 60' shown in FIG. 7 are used for creating a delay circuit.

FIG. 10 is a circuit diagram showing a configuration of a semiconductor device 70C using the universal logic cell 60' according to the present embodiment. In the semiconductor device 70C as shown in FIG. 10, a plurality of the universal logic cells 60' (60a to 60d) are used for preparing a delay circuit. Arrangement of the nodes 1 to 7 and the output terminal 9 in each universal logic cell 60' is shown in a magnified drawing in FIG. 10. Interconnections in the customize interconnection layers are formed with respect to each of the universal logic cells 60a to 60d in the same way as in the above-mentioned second embodiment, and thereby delay circuits are formed. Then, by connecting the universal logic cells 60a to 60d (delay circuits) in series, a large delay circuit capable of providing a longer delay time can be achieved.

For example, as shown in FIG. 10, a first interconnection 81C connects the node 3, the node 4 and the node 5 of the first universal logic cell 60a among the plurality of the universal logic cells 60'. A second interconnection 82C connects the node 1 of the first universal logic cell 60a and the power supply line 11. Similarly, a third interconnection 83C connects the node 3, the node 4 and the node 5 of the second universal logic cell 60b among the plurality of the universal logic cells 60'. A fourth interconnection 84C connects the node 1 of the second universal logic cell 60b and the power supply line 11. The first to fourth interconnections 81C to 84C are formed in the customize interconnection layers. In this case, the output terminal 9 of the first universal logic cell 60a is connected to the node 2 of the second universal logic cell 60b through an inter-cell interconnection 85C. The inter-cell interconnection 85C is also formed in the customize interconnection layers. By applying the same kind of inter-cell interconnections to the other universal logic cells 60' as well, the universal logic cells 60a to 60d are connected in series. As a result, a delay circuit providing a large delay time can be realized. It should be noted that in FIG. 10 the node 2 of the first universal logic cell 60a is used as an input 71 of the delay circuit, and the output terminal 9 of the universal logic cell 60d is used as an output 72 of the delay circuit.

According to the present embodiment, as described above, it is possible to realize a delay circuit providing a further long delay time with the use of the plurality of universal logic cells 60a to 60d, and to develop the semiconductor device 70C having such the delay circuit.

Fifth Embodiment

In a fifth embodiment of the present invention, the universal logic cell 60' shown in FIGS. 4 to 7 is used as in the foregoing embodiments. Therefore, description regarding the universal logic cell 60' is omitted. According to the present embodiment, a predetermined number of the universal logic cells 60' among the plurality of the universal logic cells 60' shown in FIG. 7 are used for creating a delay circuit.

FIG. 11 is a circuit diagram showing a configuration of a semiconductor device 70D using the universal logic cell 60' according to the present embodiment. In the semiconductor device 70D as shown in FIG. 11, a plurality of the universal logic cells 60' (60a to 60d) are used for preparing a delay circuit. Arrangement of the nodes 1 to 7 and the output terminal 9 in each universal logic cell 60' is shown in a magnified drawing in FIG. 11. Interconnections in the customize interconnection layers are formed with respect to each of the universal logic cells 60a to 60d in the same way as in the above-mentioned third embodiment, and thereby delay circuits are formed. Then, by connecting the universal logic cells 60a to 60d (delay circuits) in series, a large delay circuit capable of providing a longer delay time can be achieved.

For example, as shown in FIG. 11, a first interconnection 81D connects the node 2, the node 6 and the node 7 of the first universal logic cell 60a among the plurality of the universal logic cells 60'. A second interconnection 82D connects the node 1 of the first universal logic cell 60a and the ground line 12. Similarly, a third interconnection 83D connects the node 2, the node 6 and the node 7 of the second universal logic cell 60b among the plurality of the universal logic cells 60'. A fourth interconnection 84D connects the node 1 of the second universal logic cell 60b and the ground line 12. The first to fourth interconnections 81D to 84D are formed in the customize interconnection layers. In this case, the output terminal 9 of the first universal logic cell 60a is connected to the node 3 of the second universal logic cell 60b through an inter-cell interconnection 85D. The inter-cell interconnection 85D is also formed in the customize interconnection layers. By applying the same kind of inter-cell interconnections to the other universal logic cells 60' as well, the universal logic cells 60a to 60d are connected in series. As a result, a delay circuit providing a large delay time can be realized. It should be noted that in FIG. 11 the node 3 of the first universal logic cell 60a is used as an input 71 of the delay circuit, and the output terminal 9 of the universal logic cell 60d is used as an output 72 of the delay circuit.

According to the present embodiment, as described above, it is possible to realize a delay circuit providing a further long delay time with the use of the plurality of universal logic cells 60a to 60d, and to develop the semiconductor device 70D having such the delay circuit.

It is apparent that the present invention is not limited to the above embodiment, and that may be modified and changed without departing from the scope and spirit of the invention.

What is claimed is:

1. A semiconductor device comprising:
   a plurality of universal logic cells;
   a power supply line;
   a ground line;
   a first interconnection; and
   a second interconnection,
   wherein each of said plurality of universal logic cells includes:
   an inverter whose input is connected to a first node;
   a first P-channel transistor whose gate, source and drain are connected to a second node, said power supply line and a fourth node, respectively;
   a first N-channel transistor whose gate, source and drain are connected to said second node, said ground line and a fifth node, respectively;
   a first transfer gate including a P-channel transistor whose gate is connected to said first node, wherein an input and an output of said first transfer gate are connected to said fourth node and an output terminal, respectively;
   a second transfer gate including an N-channel transistor whose gate is connected to an output of said inverter, wherein an input and an output of said second transfer gate are connected to said fifth node and said output terminal, respectively;
   a second P-channel transistor whose gate, source and drain are connected to a third node, said power supply line and a sixth node, respectively;
   a second N-channel transistor whose gate, source and drain are connected to said third node, said ground line and a seventh node, respectively;
   a third transfer gate including a P-channel transistor whose gate is connected to an output of said inverter, wherein an input and an output of said third transfer gate are connected to said sixth node and said output terminal, respectively; and
   a fourth transfer gate including an N-channel transistor whose gate is connected to said first node, wherein an input and an output of said fourth transfer gate are connected to said seventh node and said output terminal, respectively,
   wherein said first interconnection connects said third node, said fourth node and said fifth node of a first universal logic cell of said plurality of universal logic cells, and
   said second interconnection connects said power supply line and said first node of said first universal logic cell.

2. The semiconductor device according to claim 1, further comprising:
   a third interconnection;
   a fourth interconnection; and
   an inter-cell interconnection,
   wherein said third interconnection connects said third node, said fourth node and said fifth node of a second universal logic cell of said plurality of universal logic cells,
   said fourth interconnection connects said power supply line and said first node of said second universal logic cell, and
   said inter-cell interconnection connects said output terminal of said first universal logic cell and said second node of said second universal logic cell.

3. The semiconductor device according to claim 1, wherein said plurality of universal logic cells are arranged in a matrix.

4. The semiconductor device according to claim 1, wherein at least a portion of an interconnection of each of said first node, said third node, said fourth node and said fifth node is formed in a top layer of common interconnection layers which are allocated to said each universal logic cell, while said first interconnection and said second interconnection are formed in a customize interconnection layer provided on said common interconnection layers.

5. The semiconductor device according to claim 2, wherein at least a portion of an interconnection of each of said first node, said second node, said third node, said fourth node, said fifth node and said output terminal is formed in a top layer of common interconnection layers which are allocated to said each universal logic cell, while said first interconnection, said second interconnection, said third interconnection, said fourth interconnection and said inter-cell interconnection are formed in a customize interconnection layer provided on said common interconnection layers.

6. A semiconductor device comprising:
a plurality of universal logic cells;
a power supply line;
a ground line;
a first interconnection; and
a second interconnection,
wherein each of said plurality of universal logic cells includes:
an inverter whose input is connected to a first node;
a first P-channel transistor whose gate, source and drain are connected to a second node, said power supply line and a fourth node, respectively;
a first N-channel transistor whose gate, source and drain are connected to said second node, said ground line and a fifth node, respectively;
a first transfer gate including a P-channel transistor whose gate is connected to said first node, wherein an input and an output of said first transfer gate are connected to said fourth node and an output terminal, respectively;
a second transfer gate including an N-channel transistor whose gate is connected to an output of said inverter, wherein an input and an output of said second transfer gate are connected to said fifth node and said output terminal, respectively;
a second P-channel transistor whose gate, source and drain are connected to a third node, said power supply line and a sixth node, respectively;
a second N-channel transistor whose gate, source and drain are connected to said third node, said ground line and a seventh node, respectively;
a third transfer gate including a P-channel transistor whose gate is connected to an output of said inverter, wherein an input and an output of said third transfer gate are connected to said sixth node and said output terminal, respectively; and
a fourth transfer gate including an N-channel transistor whose gate is connected to said first node, wherein an input and an output of said fourth transfer gate are connected to said seventh node and said output terminal, respectively,
wherein said first interconnection connects said second node, said sixth node and said seventh node of a first universal logic cell of said plurality of universal logic cells, and
said second interconnection connects said ground line and said first node of said first universal logic cell.

7. The semiconductor device according to claim 6, further comprising:
a third interconnection;
a fourth interconnection; and
an inter-cell interconnection,
wherein said third interconnection connects said second node, said sixth node and said seventh node of a second universal logic cell of said plurality of universal logic cells,
said fourth interconnection connects said ground line and said first node of said second universal logic cell, and
said inter-cell interconnection connects said output terminal of said first universal logic cell and said third node of said second universal logic cell.

8. The semiconductor device according to claim 6, wherein said plurality of universal logic cells are arranged in a matrix.

9. The semiconductor device according to claim 6, wherein at least a portion of an interconnection of each of said first node, said second node, said sixth node and said seventh node is formed in a top layer of common interconnection layers which are allocated to said each universal logic cell, while said first interconnection and said second interconnection are formed in a customize interconnection layer provided on said common interconnection layers.

10. The semiconductor device according to claim 7, wherein at least a portion of an interconnection of each of said first node, said second node, said third node, said sixth node, said seventh node and said output terminal is formed in a top layer of common interconnection layers which are allocated to said each universal logic cell, while said first interconnection, said second interconnection, said third interconnection, said fourth interconnection and said inter-cell interconnection are formed in a customize interconnection layer provided on said common interconnection layers.

11. A semiconductor device comprising:
a plurality of universal logic cells;
a power supply line; and
a ground line,
wherein each of said plurality of universal logic cells includes:
an inverter whose input is connected to a first node;
a first P-channel transistor whose gate, source and drain are connected to a second node, said power supply line and a fourth node, respectively;
a first N-channel transistor whose gate, source and drain are connected to said second node, said ground line and a fifth node, respectively;
a first transfer gate including a P-channel transistor whose gate is connected to said first node, wherein an input and an output of said first transfer gate are connected to said fourth node and an output terminal, respectively;
a second transfer gate including an N-channel transistor whose gate is connected to an output of said inverter, wherein an input and an output of said second transfer gate are connected to said fifth node and said output terminal, respectively;
a second P-channel transistor whose gate, source and drain are connected to a third node, said power supply line and a sixth node, respectively;
a second N-channel transistor whose gate, source and drain are connected to said third node, said ground line and a seventh node, respectively;
a third transfer gate including a P-channel transistor whose gate is connected to an output of said inverter, wherein an input and an output of said third transfer gate are connected to said sixth node and said output terminal, respectively; and
a fourth transfer gate including an N-channel transistor whose gate is connected to said first node, wherein an input and an output of said fourth transfer gate are connected to said seventh node and said output terminal, respectively,
wherein at least a portion of an interconnection of each of said first node, said second node, said third node, said fourth node, said fifth node, said sixth node, said seventh node and said output terminal is formed in a top layer of common interconnection layers which are allocated to said each universal logic cell.

12. The semiconductor device according to claim 11, further comprising a via formed on said top layer.

13. The semiconductor device according to claim 11, further comprising:
a first interconnection; and
a second interconnection, wherein said first interconnection connects said third node, said fourth node and said fifth node of a first universal logic cell of said plurality of universal logic cells, and said second interconnection connects said power supply line and said first node of said first universal logic cell.

14. The semiconductor device according to claim 13, wherein said first interconnection and said second interconnection are formed in a customize interconnection layer provided on said common interconnection layers.

15. The semiconductor device according to claim 13, further comprising:

a third interconnection;

a fourth interconnection; and an inter-cell interconnection, wherein said third interconnection connects said third node, said fourth node and said fifth node of a second universal logic cell of said plurality of universal logic cells, said fourth interconnection connects said power supply line and said first node of said second universal logic cell, and said inter-cell interconnection connects said output terminal of said first universal logic cell and said second node of said second universal logic cell.

16. The semiconductor device according to claim 15, wherein said first interconnection, said second interconnection, said third interconnection, said fourth interconnection and said inter-cell interconnection are formed in a customize interconnection layer provided on said common interconnection layers.

17. The semiconductor device according to claim 11, further comprising:

a first interconnection; and a second interconnection, wherein said first interconnection connects said second node, said sixth node and said seventh node of a first universal logic cell of said plurality of universal logic cells, and said second interconnection connects said ground line and said first node of said first universal logic cell.

18. The semiconductor device according to claim 17, wherein said first interconnection and said second interconnection are formed in a customize interconnection layer provided on said common interconnection layers.

19. The semiconductor device according to claim 17, further comprising:

a third interconnection;

a fourth interconnection; and an inter-cell interconnection, wherein said third interconnection connects said second node, said sixth node and said seventh node of a second universal logic cell of said plurality of universal logic cells, said fourth interconnection connects said ground line and said first node of said second universal logic cell, and said inter-cell interconnection connects said output terminal of said first universal logic cell and said third node of said second universal logic cell.

20. The semiconductor device according to claim 19, wherein said first interconnection, said second interconnection, said third interconnection, said fourth interconnection and said inter-cell interconnection are formed in a customize interconnection layer provided on said common interconnection layers.

* * * * *